US012666888B2

(12) United States Patent
Edmonds et al.

(10) Patent No.: US 12,666,888 B2
(45) Date of Patent: Jun. 23, 2026

(54) DEPOSITION OF THICK LAYERS OF SILICON DIOXIDE

(71) Applicant: SPTS Technologies Limited, Newport (GB)

(72) Inventors: Matt Edmonds, Newport (GB); William Royle, Newport (GB); Caitlin Lane Jones, Newport (GB); Daniel Gomez-Sanchez, Newport (GB); Kathrine Crook, Newport (GB)

(73) Assignee: SPTS Technologies Limited, Newport (GB)

( * ) Notice: Subject to any disclaimer, the term of this patent is extended or adjusted under 35 U.S.C. 154(b) by 347 days.

(21) Appl. No.: 18/232,313

(22) Filed: Aug. 9, 2023

(65) Prior Publication Data

US 2024/0096616 A1 Mar. 21, 2024

(30) Foreign Application Priority Data

Sep. 21, 2022 (GB) ...................................... 2213794

(51) Int. Cl.
| | |
|---|---|
| *H01L 21/02* | (2006.01) |
| *C23C 16/52* | (2006.01) |
| *H01J 37/32* | (2006.01) |
| *H10P 14/60* | (2026.01) |
| *H10P 14/692* | (2026.01) |
| *H10P 14/694* | (2026.01) |
| *H10W 70/69* | (2026.01) |

(52) U.S. Cl.
CPC .......... *H10P 14/6336* (2026.01); *C23C 16/52* (2013.01); *H01J 37/32165* (2013.01); *H10P 14/6682* (2026.01); *H10P 14/6686* (2026.01);

*H10P 14/69215* (2026.01); *H10P 14/69433* (2026.01); *H10W 70/69* (2026.01); *H01J 2237/3321* (2013.01)

(58) Field of Classification Search
None
See application file for complete search history.

(56) References Cited

U.S. PATENT DOCUMENTS

| | | | |
|---|---|---|---|
| 6,327,135 B1 | 12/2001 | Azuma et al. | |
| 6,374,135 B1 | 4/2002 | Bucholz | |
| 7,192,855 B2 * | 3/2007 | Filipiak ................. | H10D 30/60 |
| | | | 438/513 |
| 8,076,250 B1 | 12/2011 | Rajagopalan et al. | |
| 8,329,575 B2 | 12/2012 | Rajagopalan et al. | |
| 9,165,762 B2 | 10/2015 | Crook et al. | |
| 9,472,610 B2 | 10/2016 | Crook et al. | |

(Continued)

OTHER PUBLICATIONS

Guan et al., "Stress control of plasma enhanced chemical vapor deposited silicon oxide film from tetraethoxysilane," Journal of Micromechanics and Microengineering, Dec. 23, 2013, vol. 24, pp. 1-6.

(Continued)

*Primary Examiner* — Asok K Sarkar
(74) *Attorney, Agent, or Firm* — Hodgson Russ LLP

(57) ABSTRACT

Silicon dioxide can be deposited onto a substrate by plasma enhanced chemical vapour deposition (PECVD). The substrate includes at least one silicon dioxide layer deposited thereon. A plasma enhanced chemical vapour deposition apparatus can be used to deposit silicon dioxide onto a substrate by plasma enhanced chemical vapour deposition.

22 Claims, 4 Drawing Sheets

A

B

(56) References Cited

U.S. PATENT DOCUMENTS

| | | | | |
|---|---|---|---|---|
| 10,290,508 | B1 * | 5/2019 | Kubota | H01L 21/31122 |
| 2012/0015113 | A1 | 1/2012 | Hua et al. | |
| 2013/0171834 | A1 | 7/2013 | Haverkamp et al. | |
| 2013/0288486 | A1 | 10/2013 | Crook et al. | |
| 2019/0333752 | A1 | 10/2019 | Carruthers | |
| 2019/0385954 | A1 * | 12/2019 | Rondon | H01L 21/02164 |
| 2025/0037992 | A1 * | 1/2025 | Hamma | H01L 21/0217 |

OTHER PUBLICATIONS

EPO, Extended European Search Report issued for EP Application No. 23182514.2, Feb. 23, 2024.
IPO, Search Report for GB2213794.7, Mar. 22, 2023.
Crook, K., et al., Dielectric Stack Engineering for Via-Reveal Passivation, Electronic Components & Technology Conference, 2013, pp. 576-580.
SAMCO Inc., Cathode PECVD for High-rate SiO2 and SiNx Deposition, Jun. 14, 2022, pp. 1-17.

* cited by examiner

Absorbance (a.u)

Wavenumber (cm⁻¹)

Compressive SiN

Neutral SiN

A

B

DEPOSITION OF THICK LAYERS OF SILICON DIOXIDE

CROSS-REFERENCE TO RELATED APPLICATIONS

This application claims priority to UK patent application No 2213794.7 filed Sep. 21, 2022, the disclosure of which is hereby incorporated by reference.

BACKGROUND

Dielectric thin layers are widely used in the fabrication of semiconductor devices, MEMS devices and optical and electro-optical devices or structures. During the deposition process, whether by CVD, PECVD, HDP-CVD, PEALD or ALD, stress will be incorporated into the dielectric thin layer. This stress can be due to extrinsic factors such as differences between the thermal expansion coefficient of the dielectric thin layer and an underlying substrate or intrinsic factors such as defects in the microstructure of the dielectric thin layer. The compressive or tensile stresses that can be present in the dielectric thin layers can result in undesirable wafer distortion, which in turn can prove problematic for subsequent process steps or can result in failure in the dielectric thin layer itself in the form of cracks or delamination.

Controlling stress becomes increasingly challenging when the coating thickness is increased. In applications where thick layers of $SiO_2$ having a thickness of greater than 10 μm is required, conventional PECVD processes tend to be the preferred technique for high deposition rate processes. These conventional processes tend to require low deposition rates or multiple stress balancing layers to achieve a crack free layer with minimal wafer distortion. This results in a complicated deposition process with a low total deposition rate. For example, U.S. Pat. No. 9,472,610 B2 discloses that it is not possible to deposit silicon dioxide layers having a thickness of 20 microns or greater at temperatures of 280° C. or lower without cracking due to the build-up of stress in the layer and therefore uses of alternating tensile stressed and compressive stressed laminated layers to form a deposit of silicon dioxide. US 2012/015113 A1 discloses forming multiple layers of thermal SACVD and PECVD $SiO_2$ with a total layer thickness of up to 3.5 microns.

The thermal budget that a wafer can accept is another constraint when considering the deposition process as deposition rate, layer density, and stress all are influenced by the deposition temperature. In many MEMS and 3D-packaging applications, there are demanding low-temperature constraints which limit the deposition temperatures to less than about 300° C. in order to prevent damage or warping of the device.

What is therefore required is a method to deposit thick $SiO_2$ layers at a high deposition rate with acceptable wafer warpage within the required thermal budget.

SUMMARY OF DISCLOSURE

The present disclosure, in at least some of its embodiments, addresses the above-described problems and needs.

According to a first aspect of the disclosure, there is provided a method of depositing silicon dioxide onto a substrate by plasma enhanced chemical vapour deposition (PECVD), the method comprising the steps of:

providing the substrate in a chamber;

performing a first deposition step by PECVD to deposit an intermediate layer onto the substrate, the intermediate layer comprising silicon nitride; and performing a second deposition step by PECVD to deposit at least one silicon dioxide layer onto the intermediate layer, wherein the first deposition step comprises introducing a first gas mixture comprising silane, nitrogen gas, and either hydrogen gas or ammonia gas into the chamber, and sustaining a plasma in the chamber from the first gas mixture at a temperature of between about 220° C. and about 300° C. so as to deposit the intermediate layer onto the substrate, wherein the second deposition step comprises introducing a second gas mixture comprising tetraethyl orthosilicate into the chamber, and sustaining a plasma in the chamber from the second gas mixture at a temperature of between about 220° C. and about 300° C. so as to deposit the at least one silicon dioxide layer onto the intermediate layer, and wherein the intermediate layer has an overall compressive stress of between −400 MPa and −100 MPa and each of the at least one silicon dioxide layers has an overall neutral stress of between −50 MPa and +50 MPa and the total thickness of the at least one silicon dioxide layer is at least 10 μm.

The embodiments disclosed herein can enable TEOS-based silicon dioxide layers having a total thickness of at least 10 μm to be deposited onto silicon wafers at a high deposition rate of up to 1.5 μm/minute and at a temperature within a low thermal budget without cracking. Without wishing to be bound by theory or conjecture, it is believed that the intermediate layer comprising silicon nitride (SiN) improves adhesion of the tetraethyl orthosilicate (TEOS)-based silicon dioxide ($SiO_2$) layer onto the substrate, especially if the substrate comprises or is formed of silicon (Si), and the compressive stress of the intermediate layer reduces the net stress of the intermediate layer/$SiO_2$ stack when a neutral stress $SiO_2$ layer is deposited onto the intermediate layer. The net compressive stress increases the cracking threshold of the TEOS-based $SiO_2$ layer. Surprisingly, the provision of the intermediate layer reduces the density of the TEOS-based $SiO_2$ layer, which in turn enables thicker $SiO_2$ layers to be deposited before the cracking threshold of the $SiO_2$ is reached. This effect has also been demonstrated to occur regardless of whether the intermediate layer is deposited from a plasma formed from a gas mixture comprising ammonia or a plasma formed from a gas mixture that does not contain ammonia.

The first gas mixture can be substantially free of ammonia. The first gas mixture can consist of or consist essentially of silane, nitrogen gas and hydrogen gas. Alternatively, the first gas mixture can consist of or consist essentially of silane, nitrogen gas and ammonia gas. The second gas mixture can further comprise oxygen gas. The second gas mixture can further comprise hydrogen gas. The second gas mixture can further comprise helium gas. The second gas mixture can consist of or consist essentially of tetraethyl orthosilicate, helium gas, hydrogen gas and oxygen gas.

During the first deposition step, the silane, nitrogen gas, hydrogen gas and ammonia can be each introduced into the chamber at an associated flow rate in sccm. During the second deposition step, the tetraethyl orthosilicate, helium gas, hydrogen gas and oxygen gas can be each introduced into the chamber at an associated flow rate in sccm. During the second deposition step, the helium gas can be introduced into the chamber through two or more gas inlets. Preferably, the helium gas flow rate from a first gas inlet of the two or more gas inlets can be higher than a helium gas flow rate from a second gas inlet of the two or more gas inlets. Preferably, the first gas inlet can also act as a gas inlet for introducing tetraethyl orthosilicate into the chamber. By having at least two separate sources of helium gas into the chamber, the helium gas introduced into the chamber through the first gas inlet can act as a carrier gas for the tetraethyl orthosilicate introduced into the chamber through the first gas inlet and the helium gas introduced into the chamber through the second gas inlet can act to stabilize the plasma and maintain reproducible operation.

Silane can be introduced into the chamber during the first deposition step at a flow rate in the range of about 50 sccm to about 400 sccm, optionally about 90 sccm to about 350 sccm, optionally about 180 to about 330 sccm or optionally about 325 sccm.

Nitrogen gas can be introduced into the chamber during the first deposition step at a flow rate in the range of about 2000 sccm to about 8,000 sccm, optionally about 2500 sccm to about 7,000 sccm, optionally about 2600 sccm to about 6,500 sccm, or optionally about 6,000 sccm.

If present in the first deposition step, hydrogen gas can be introduced into the chamber at a flow rate in the range of about 250 to about 750 sccm, optionally about 400 sccm to about 600 sccm, or optionally about 500 sccm.

If present in the first deposition step, ammonia gas can be introduced into the chamber at a flow rate in the range of about 25 sccm to about 500 sccm, optionally about 35 sccm to about 475 sccm, or optionally about 450 sccm.

Tetraethyl orthosilicate can be introduced into the chamber during the second deposition step at a flow rate in the range of about 1 sccm to about 10 sccm, optionally about 3 sccm to about 7 sccm, or optionally about 5 sccm.

If present in the second deposition step, oxygen gas can be introduced into the chamber during the second deposition step at a flow rate in the range of about 1.0 slpm to about 10 slpm, optionally about 4.0 slpm to about 8.0 slpm, or optionally about 6.5 slpm.

If present in the second deposition step, hydrogen gas can be introduced into the chamber during the second deposition step at a flow rate in the range of about 0.25 to about 2.0 slpm, optionally about 0.75 slpm to about 1.5 slpm, or optionally about 1.0 slpm.

If present in the second deposition step, the total flow rate of helium gas can be introduced into the chamber in the second deposition step at a flow rate in the range of about 1000 sccm to about 2000 sccm, optionally about 1200 sccm to about 1650 sccm, or optionally about 1450 sccm. The flow rate of helium gas introduced into the chamber in the second deposition step through the first gas inlet of the at least two gas inlets can be in the range of about 600 sccm to about 1900 sccm, optionally about 800 sccm to about 1650 sccm, or optionally about 1250 sccm. The flow rate of helium gas introduced into the chamber in the second deposition step through the second gas inlet of the at least two gas inlets can be in the range of about 50 sccm to about 500 sccm, optionally about 100 sccm to about 300 sccm, or optionally about 200 sccm.

During the first deposition step, the process temperature can be less than about 280° C. The process temperature can be more than about 225° C. During the first deposition step, the process temperature can be about 250° C. During the second deposition step, the process temperature can be less than about 280° C. The process temperature can be more than about 225° C. During the second deposition step, the process temperature can be about 250° C. Maintaining the substrate at these temperatures can keep the substrate within low thermal budget constraints, which makes the present method suitable for depositing silicon nitride and silicon dioxide layers onto temperature sensitive substrates. For example, the method can be used to deposit silicon nitride and silicon dioxide layers onto temperature sensitive substrates comprising device layers and/or interconnects, which may include copper layers embedded in a dielectric or die attached to substrates.

Whilst the plasma is being sustained in the chamber in the first deposition step, the chamber can have a pressure in the range of about 1 Torr to about 3 Torr, or optionally about 2 Torr. Whilst the plasma is being sustained in the chamber in the second deposition step, the chamber can have a pressure in the range of about 3 Torr to about 5 Torr, or optionally about 4 Torr.

The steps of the first aspect of the disclosure can be performed in a capacitively coupled PECVD reactor.

The plasma in the first deposition step is sustained using a high frequency RF power in the range of about 500 W to about 1500 W, optionally about 540 W to about 1320 W, or optionally about 700 W to about 1000 W. The high frequency RF power in the first deposition step can have a frequency in the range of about 10 MHz to about 15 MHz, preferably 13.56 MHz.

The plasma in the second deposition step can be sustained using a high frequency RF power. Preferably, the plasma can be sustained using a high frequency RF power and a low frequency RF power.

The high frequency RF power in the second deposition step can have a frequency in the range of about 10 MHz to about 15 MHz, preferably 13.56 MHz. The high frequency RF power in the second deposition step can have a power in the range of about 1500 W to about 3000 W, optionally about 1750 W to 2300 W, or optionally about 1950 W.

The low frequency RF power in the second deposition step can have a frequency in the range of 100 kHz to about 500 kHz, optionally about 200 kHz to about 450 kHz, optionally about 300 kHz to about 400 kHz, or optionally about 375 kHz. The low frequency RF power can is the second deposition step have a power in the range of about 200 W to about 600 W, optionally about 400 W to about 550 W, or optionally about 350 W.

The overall compressive stress of the intermediate layer can be at least −100 MPa, optionally at least −200 MPa, optionally at least −250 MPa or optionally at least −300 MPa. The thickness of the intermediate layer can be at least 0.05 µm, optionally at least 0.25 µm, or optionally at least 0.5 µm. The overall neutral stress of each of the at least one silicon dioxide layer can be between −30 MPa and +30 MPa. The overall stress of the at least one silicon dioxide layer can be between −50 MPa and +50 MPa, optionally between −30 MPa and +30 MPa. The total thickness of the silicon dioxide layer can be at least 20 µm, optionally at least 30 µm, or optionally at least 40 µm. The thickness of each of the at least one silicon dioxide layers can be at least 1 µm, optionally at least 2 µm, or optionally at least 5 µm. The at least one silicon dioxide layer can be deposited onto the intermediate layer at a deposition rate of at least 1.0 µm/minute, optionally at least 1.25 µm/minute, or optionally at least 1.5 µm/minute.

The at least one silicon dioxide layer can consist of or consist essentially of a single silicon dioxide layer. Alternatively, the at least one silicon dioxide layer can consist of two or more silicon dioxide layers. The two or more silicon dioxide layers can be deposited in the same chamber. The second deposition step can be performed directly after the first deposition step without a break in the vacuum conditions within the chamber. Alternatively, the substrate can be removed from the chamber between the first deposition step and the second deposition step. The substrate can be transferred to a different chamber between the first deposition step and the second deposition step. Alternatively, the first deposition step and the second deposition step can be carried out in the same chamber. The present inventors have found that the substrate can be removed from the chamber after the first deposition step, and thereby causing a break in the vacuum conditions, without a noticeable change in the process performance of the intermediate layer-silicon dioxide stack. Therefore, the substrate can be processed in the same chamber or in different chambers with equal performance, allowing for improved process efficiency and process flexibility.

The substrate can be a semiconductor substrate. The substrate can be a silicon-containing substrate. The semiconductor substrate can be silicon.

According to a second aspect of the disclosure there is provided a substrate with at least one silicon dioxide layer deposited thereon using the method according to the first aspect, wherein each of the at least one silicon dioxide layer has an overall neutral stress of between −50 MPa and +50 MPa and the total thickness of the at least one silicon dioxide layer is at least 10 μm.

The substrate can be a semiconductor substrate. The substrate can be a silicon-containing substrate. The substrate can be silicon. The substrate can comprise a plurality of die. The substrate can comprise features, such as one or more device layers and/or interconnects or die attached to the substrate. The features may be temperature sensitive. The features can comprise copper layers, for example, copper layers embedded in a dielectric material. The overall neutral stress of each of the at least one silicon dioxide layer can be between −30 MPa and +30 MPa. The overall stress of the at least one silicon dioxide layer can be between −50 MPa and +50 MPa, optionally between −30 MPa and +30 MPa. The total thickness of the at least one silicon dioxide layer can be at least 20 μm, optionally at least 30 μm, or optionally at least 40 μm. The thickness of each of the at least one silicon dioxide layers can be at least 1 μm, optionally at least 2 μm, or optionally at least 5 μm.

According to a third aspect of the disclosure, there is provided a plasma enhanced chemical vapour deposition apparatus for depositing silicon dioxide onto a substrate by plasma enhanced chemical vapour deposition using the method according to the first aspect of the disclosure, the apparatus comprising:

a chamber;

a substrate support disposed within the chamber for supporting a substrate thereon;

at least one gas inlet for introducing a gas or gas mixture into the chamber at a flow rate;

a plasma generating means for sustaining a plasma in the chamber;

a high frequency power supply means configured to supply a high frequency RF power supply to the at least one gas inlet;

a low frequency power supply means configured to supply a low frequency RF power supply to at least one of the substrate support and the at least one gas inlet; and a controller configured to switch between a first set of processing conditions and a second set of processing conditions, wherein the first set of processing conditions are configured to perform a first deposition step to deposit an intermediate layer onto the substrate, the intermediate layer comprising silicon nitride and the second set of processing conditions are configured to perform a second deposition step to deposit at least one silicon dioxide layer onto the intermediate layer, wherein the first set of processing conditions are configured to perform the first deposition step by introducing a first gas mixture comprising silane, nitrogen gas, and either hydrogen gas or ammonia gas into the chamber through the at least one gas inlet, and sustaining a plasma in the chamber from the first gas mixture using the plasma generating means at a temperature of between about 220° C. and about 300° C. so as to deposit the intermediate layer onto the substrate, wherein the second set of processing conditions are configured to perform the second deposition step by introducing a second gas mixture comprising tetraethyl orthosilicate into the chamber through the at least one gas inlet, and sustaining a plasma in the chamber from the second gas mixture using the plasma generating means at a temperature of between about 220° C. and about 300° C. so as to deposit the at least one silicon dioxide layer onto the intermediate layer.

The second gas mixture can further comprise oxygen gas. The second gas mixture can further comprise hydrogen gas. The second gas mixture can further comprise helium gas. The at least one gas inlet can comprise two or more gas inlets. Preferably, a first gas inlet of the two or more gas inlets is configured to introduce helium gas and tetraethyl orthosilicate into the chamber, and a second gas inlet of the two or more gas inlets is configured to introduce helium gas into the chamber. The low frequency power supply means can be configured to supply a low frequency RF power supply to the at least one gas inlet.

Whist embodiments have been described above, it extends to any inventive combination of the features set out above, or in the following description, drawings or claims. For example, any features disclosed in relation to one aspect of the disclosure may be combined with any features disclosed in relation to any of the other aspects of the disclosure.

For the avoidance of doubt, whenever reference is made herein to 'comprising' or 'including' and like terms, the disclosure is also understood to include more limiting terms such as 'consisting' and 'consisting essentially'.

For the avoidance of doubt, measurements of stress with a negative numerical value are understood to indicate compressive stress, whereas measurements of stress with a positive numerical value are understood to indicate tensile stress.

For the avoidance of doubt, silicon nitride or SiN deposited by PECVD in the temperature range of interest is understood to be an amorphous film comprising or consisting of Silicon, Nitrogen and Hydrogen and in some embodiments may be described as $\alpha$-SiN:H or $\alpha$-Si$_{1-x}$ N$_x$:H$_y$. The proportions of Si, N and H can vary with deposition parameters. However, for convenience and brevity, these films are referred to herein as silicon nitride or SiN. These films have excellent dielectric properties. PECVD silicon dioxide or SiO$_2$ films deposited from TEOS precursors are also amorphous dielectric films which incorporate Hydrogen atoms and potentially trace amounts of Carbon. PECVD TEOS-based oxides deposited in the temperature range of interest are not stoichiometric SiO$_2$ but are an amorphous film comprising or consisting of Silicon, Oxygen and Hydrogen and in some embodiments may be described as $\alpha$-SiO:H or $\alpha$-Si$_{1-x}$ O$_x$:H$_y$ films. However, for convenience and brevity, these PECVD TEOS-based oxides are referred to herein as Silicon Dioxide or SiO$_2$.

DESCRIPTION OF FIGURES

Embodiments of the disclosure will now be described, by way of example only, with reference to the accompanying drawings, in which.

DETAILED DESCRIPTION

Figure 1:
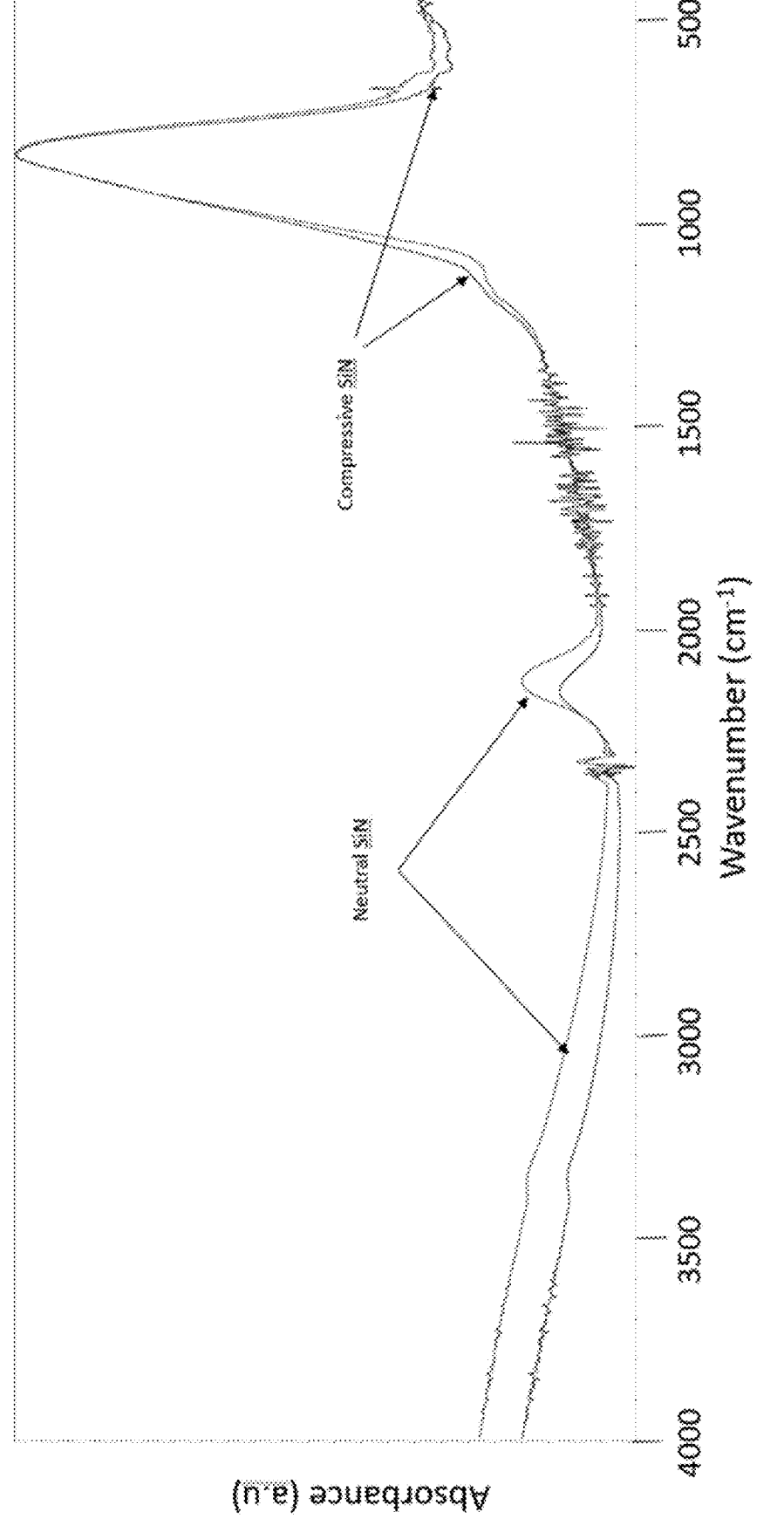
FIG. 1 shows FTIR spectra for PECVD SiN layers from N$_2$/H$_2$ precursors with both neutral and compressive stress.

Apparatus suitable for depositing intermediate layers and silicon dioxide layers according to exemplary methods of the present disclosure (and comparative examples) include an SPTS Delta™ fxP parallel plate PECVD apparatus, which is commercially available from SPTS Technologies Limited, located in Newport, South Wales, UK. All exemplary embodiments and comparative examples described below were performed using this apparatus. However, it is anticipated that the results could be achieved on capacitively coupled PECVD systems in general. Stress measurements were made on a Tenor Flx™ 3300-R system.

In the exemplary methods below, the intermediate layer is formed of silicon nitride (SiN). However, it is anticipated that intermediate layers comprising one or more other components in addition to SiN would also demonstrate the advantages discussed below.

The PECVD apparatus of the present disclosure comprises a chamber, a substrate support disposed within the chamber for supporting a substrate thereon, at least one gas inlet for introducing a gas or gas mixture into the chamber at a flow rate, a plasma generating means for sustaining a plasma in the chamber, a high frequency power supply means configured to supply a high frequency RF power supply to the at least one gas inlet, a low frequency power supply means configured to supply a low frequency RF power supply to at least one of the substrate support and the at least one gas inlet, and a controller. The controller is configured to switch between a first set of processing conditions and a second set of processing conditions, wherein the first set of processing conditions are configured to perform a first deposition step to deposit an intermediate layer onto the substrate, the intermediate layer comprising silicon nitride and the second set of processing conditions are configured to perform a second deposition step to deposit at least one silicon dioxide layer onto the intermediate layer. The first set of processing conditions are configured to perform the first deposition step by introducing a first gas mixture comprising silane, nitrogen gas, and either hydrogen gas or ammonia gas into the chamber through the at least one gas inlet, and sustaining a plasma in the chamber from the first gas mixture using the plasma generating means at a temperature of between about 220° C. and about 300° C. so as to deposit the intermediate layer onto the substrate. The second set of processing conditions are configured to perform the second deposition step by introducing a second gas mixture comprising tetraethyl orthosilicate, helium gas, hydrogen gas and oxygen gas into the chamber through the at least one gas inlet, and sustaining a plasma in the chamber from the second gas mixture using the plasma generating means at a temperature of between about 220° C. and about 300° C. so as to deposit the at least one silicon dioxide layer onto the intermediate layer.

The at least one gas inlet can comprise two or more gas inlets. Preferably, a first gas inlet of the two or more gas inlets is configured to introduce helium gas and tetraethyl orthosilicate into the chamber, and a second gas inlet of the two or more gas inlets is configured to introduce helium gas into the chamber.

Two RF power supplies operating at 13.56 MHz and 375 kHz are coupled to a gas distribution plate, also known as a "showerhead", positioned towards the top of the chamber. The substrate is positioned coaxially with on the substrate support below the gas distribution plate. The substrate support is resistively heated and due to a cooling mechanism is able to control the substrate support and in turn the substrate temperature. A plasma is generated between the gas distribution plate and the substrate support/substrate when the appropriate RF and process gas pressures are achieved. The chamber is evacuated by a pumping system and is attached to a transport module which operates under vacuum.

The substrate is preferably a semiconductor substrate and most preferably is formed of silicon. In the embodiments discussed herein, the substrate is in the form of a 300 mm diameter silicon wafer with a standard thickness of approximately 775 µm. However, other substrate materials, substrate geometries, diameters and thicknesses may also be used in the method and apparatus of the present disclosure. It will be appreciated that deposition conditions required, including gas flow rates, chamber pressures and power applied to the substrate and/or the gas inlet, to perform the present disclosure would be expected to vary with substrate material and geometry in a manner known in the art. In the embodiments discussed herein, the silicon wafers had trenches formed in the upper surface of the silicon wafer, the trenches having a depth of approximately 40 µm, and the method of the present disclosure was used to fill the trenches with a deposited silicon dioxide layer. However, the silicon dioxide layer may equally be deposited on other features of such a substrate, including vias, bare silicon surfaces or die attached to the substrate surface.

The present inventors have discovered that by coating a substrate, especially one comprising or consisting of silicon, with an intermediate layer comprising SiN, it is possible to substantially increase the thickness of a neutral/low stress TEOS-based SiO$_2$ layer that could be deposited before cracking or delamination occurred. Without an intermediate layer comprising SiN, the maximum thickness of SiO$_2$ that could previously be deposited without cracking or delamination was 20 µm, and only by lamination of multiple layers of alternating tensile and compressive stress or at a very low deposition rate. However, when using an 0.5 µm thick intermediate layer comprising SiN deposited by PECVD, a SiO$_2$ layer thickness of greater than 30 µm was obtained for a neutral stress (+22 MPa) intermediate layer and a SiO$_2$ layer thickness of greater than 40 µm was obtained for a compressive stress (−200 MPa) intermediate layer at a deposition rate of up to 1.5 µm/minute. This increase in the cracking threshold thickness has been observed at intermediate layer thicknesses of between 0.05 μm and 0.5 μm, although this effect would be expected to also extend to thicker intermediate layers.

Figure 4:
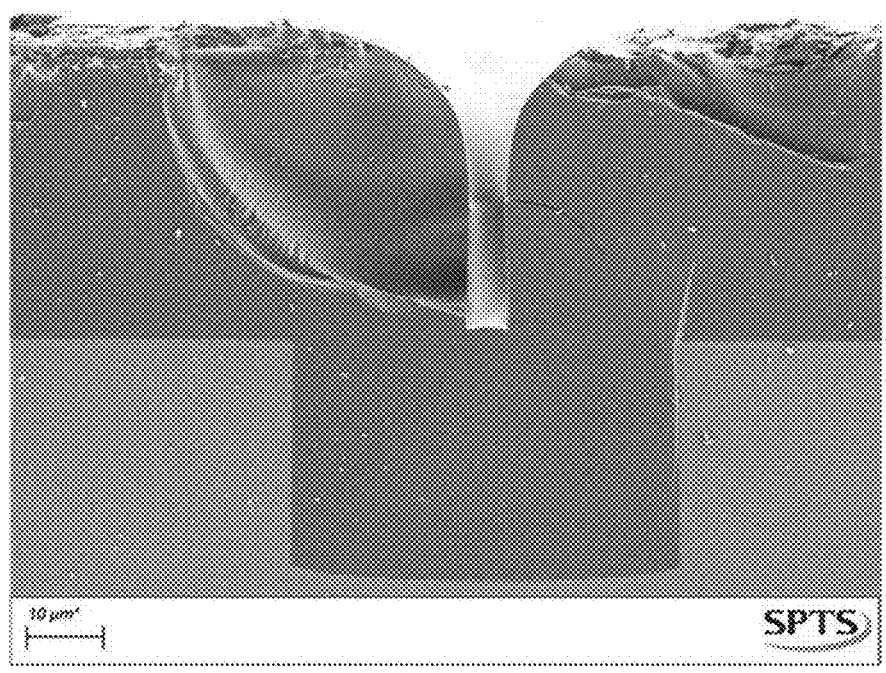
FIG. 4 shows SEM images of 40 µm trenches formed in a silicon substrate coated with a layer of silicon dioxide A) without an intermediate layer according to the present disclosure and B) with an intermediate layer according to the present disclosure.
Figure 4:
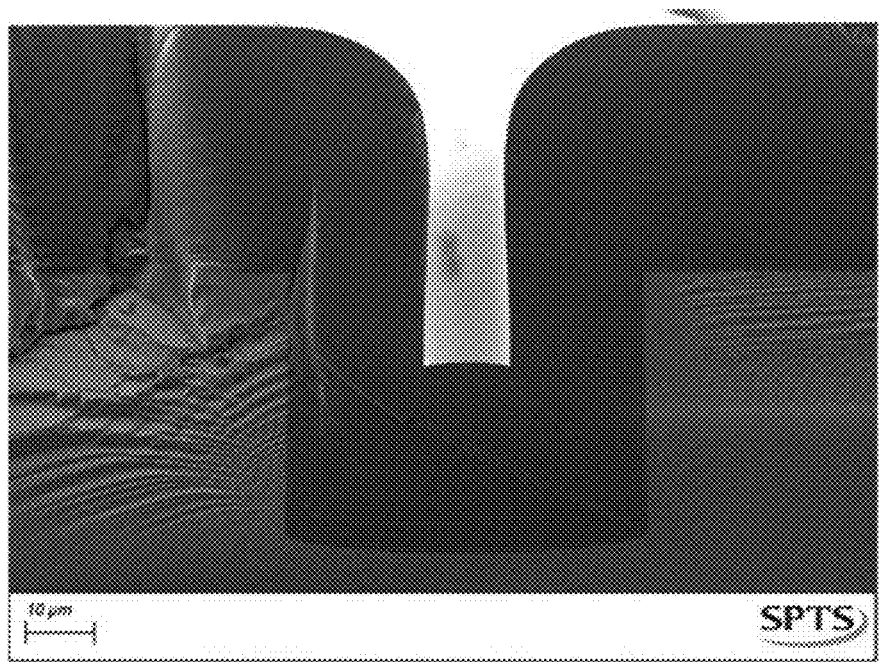

A comparison between a substrate treated by prior methods and a substrate treated according to an embodiment of the method of the present disclosure is shown in FIG. 4. FIG. 4 shows two SEM images of cross-sectioned 40 μm deep trenches in silicon deposition of an approximately 40 μm neutral stress TEOS-based $SiO_2$ layer. In the image labelled "A", there is no intermediate layer between the $SiO_2$ layer and the substrate, whereas in the image labelled "B", an $N_2/H_2$-based compressive SiN layer with an overall stress of approximately −200 MPa was deposited first, followed by deposition of a single neutral stress TEOS-based $SiO_2$ layer. Severe cracking is observed in image A, for example on both the middle of the right-hand wall of the trench and near to the upper surface of the $SiO_2$ layer. In comparison, image B shows no evidence of cracking other than cleave damage from the preparation of the sample.

EXEMPLARY EMBODIMENTS

Exemplary embodiments of the disclosure comprise introducing silane ($SiH_4$), nitrogen gas ($N_2$), and either hydrogen gas ($H_2$) or ammonia gas ($NH_3$) into a PECVD chamber in a first deposition step. A plasma is sustained within the chamber so that a PECVD process can occur, which causes an intermediate layer comprising silicon nitride (SiN) to deposit onto the substrate. Preferably, the intermediate layer consists of or consists essentially of SiN.

In a second deposition step after the first deposition step, a gas mixture comprising tetraethyl orthosilicate (TEOS), oxygen gas ($O_2$), $H_2$ and helium gas (He) is introduced into a PECVD chamber containing the substrate, which may be the same or a different chamber to the chamber used in the first deposition step. A plasma is sustained within the chamber so that a PECVD process can occur, which causes at least one silicon dioxide ($SiO_2$) layer to be deposited on the intermediate layer.

It may be preferable to avoid the use of ammonia in the first deposition step to produce the intermediate layer. Therefore, the present inventors investigated the properties of the intermediate layer with and without ammonia in the first deposition step. The process conditions used to deposit each of the $NH_3$-free and $NH_3$-based SiN layers are given below in Table 1. The deposition in each case was carried out at 250° C.

TABLE 1

| Process Parameter | Neutral $N_2/H_2$ SiN | Compressive $N_2/H_2$ SiN | Neutral $N_2/NH_3$ SiN | Compressive $N_2/NH_3$ SiN |
|---|---|---|---|---|
| Pressure (Torr) | 2.1 | 2.1 | 1.2 | 2 |
| $SiH_4$ flow rate (sccm) | 325 | 325 | 180 | 90 |
| $N_2$ flow rate (sccm) | 6000 | 6000 | 2000 | 2671 |
| $H_2$ flow rate (sccm) | 500 | 500 | 0 | 0 |
| $NH_3$ flow rate (sccm) | 0 | 0 | 450 | 37 |
| High Frequency RF Power (Watts) | 700 | 1320 | 540 | 1000 |

FIG. 1 shows the FTIR spectra for the two SiN layers on a Si substrate produced without the use of ammonia with a gas mixture of $SiH_4/N_2/H_2$. The substrate contribution has been subtracted. The spectra show peaks of absorption relating to N—H stretching at approximately 3340 cm$^{-1}$, Si—H stretching at approximately 2130 cm$^{-1}$, N—H bending at approximately 1170 cm$^{-1}$ and Si—N stretching at 850 cm$^{-1}$. With the spectra normalized on the Si—N peak we can see a slight reduction in area and increase in wavenumber of Si—H stretching peak at ~2130 cm$^{-1}$ and a shift to higher wavenumbers for the Si—N stretching peak as it approaches the N—H bending mode for the compressive SiN when compared to neutral SiN.

Figure 2:
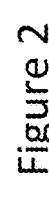
FIG. 2 shows FTIR spectra for PECVD SiN layers from NH$_3$ precursor with both neutral and compressive stress.

FIG. 2 shows the FTIR spectra for $NH_3$-based PECVD SiN layers with neutral and compressive stress. In this case, the gas mixture is $SiH_4/NH_3/N_2$. The spectra are similar to those in FIG. 1, with the exception of the N—H bending peak being more prominent for the $NH_3$-based SiN.

Figure 3:
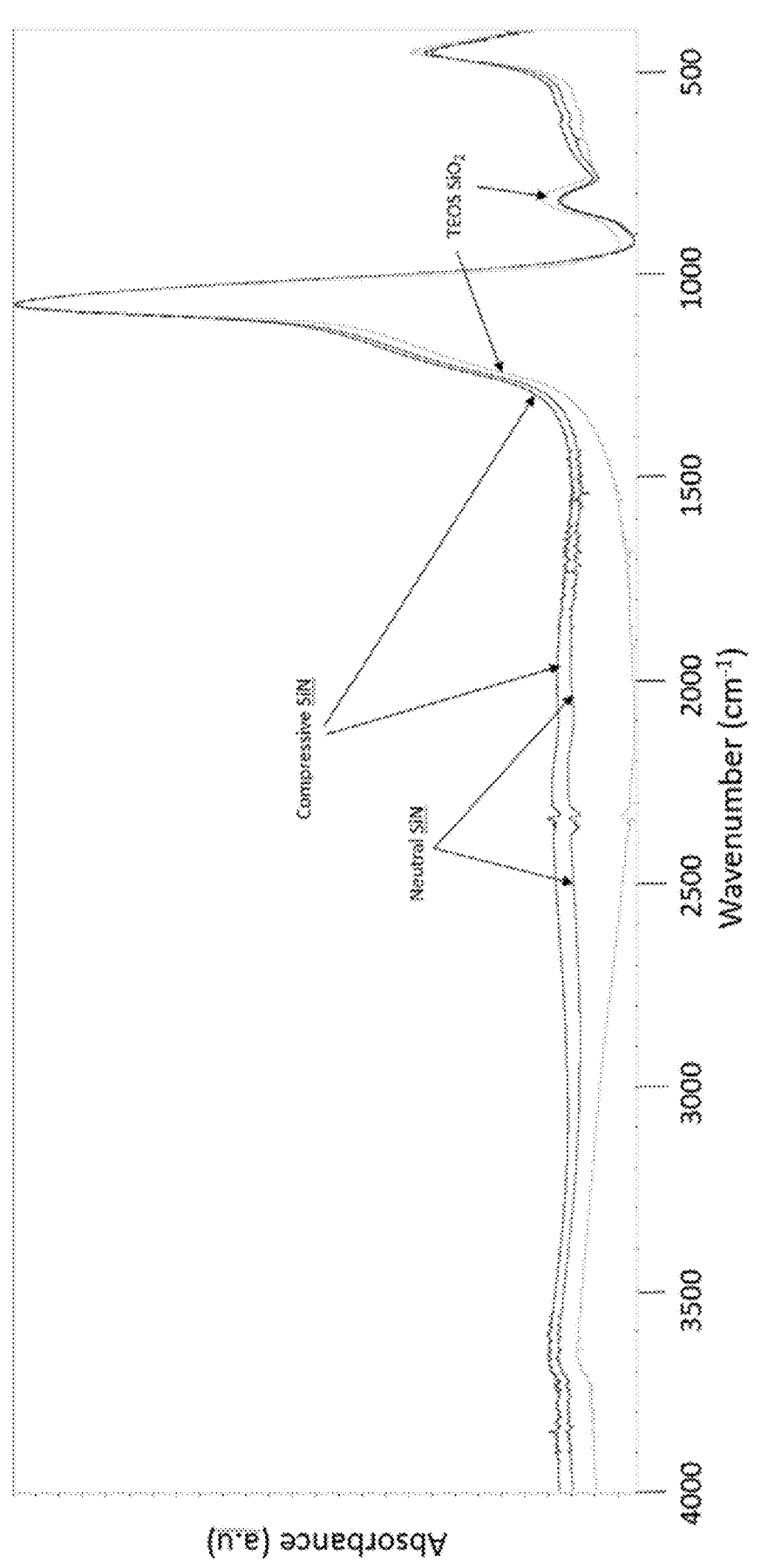
FIG. 3 shows FTIR spectra for PECVD SiO$_2$ layers from TEOS precursors deposited on SiN layers from NH$_3$ precursor with neutral stress, SiN layers from N$_2$/H$_2$ precursors with neutral stress and silicon substrate.

FIG. 3 shows FTIR absorbance spectra for 1 μm TEOS-based $SiO_2$ depositions onto silicon and $N_2/H_2$ based SiN layers onto a silicon substrate (after subtraction of the substrate and the SiN contributions). The FTIR spectra shows a gradual widening of the SiO peak centered at approximately 1083 cm$^{-1}$. Similar results are observed for the $NH_3$-based SiN layers. The changes of the width in the SiO peak is presented in Table 2 below in terms of the full width-half maximum (FWHM) of the SiO peak on silicon and the four SiN variants.

TABLE 2

| Structure | FWHM (cm$^{-1}$) |
|---|---|
| TEOS-based $SiO_2$ | 102 |
| TEOS-based $SiO_2$ on neutral stress $N_2/H_2$-based SiN | 118 |
| TEOS-based $SiO_2$ on compressive stress $N_2/H_2$-based SiN | 123 |
| TEOS-based $SiO_2$ on neutral stress $NH_3$-based SiN | 122 |
| TEOS-based $SiO_2$ on compressive stress $NH_3$-based SiN | 124 |

As can be seen from Table 2, the width of the peak increases with the introduction of the neutral SiN layer and broadens slightly further when the layer is compressed. A broader peak indicates a less dense layer which permits thicker layers to be deposited before cracking of the $SiO_2$ occurs.

The refractive index of the intermediate layers was investigated and shown below in Table 3. For both the $N_2/H_2$- and the $NH_3$-based SiN depositions, the refractive index of the $SiO_2$ layer reduces as the compressive stress in the SiN layer increases, with a more pronounced change in the refractive index of the SiN layer formed from $N_2/H_2$. The overall stress of the intermediate layers, with and without the $SiO_2$ layer on top of the intermediate layer, is also shown below in Table 4. The overall stress in the neutral stress $SiO_2$ layer without an intermediate layer was −7 MPa.

TABLE 3

| Structure | Refractive Index |
|---|---|
| neutral stress $N_2/H_2$-based SiN | 2.3488 |
| compressive stress $N_2/H_2$-based SiN | 2.1529 |
| neutral stress $NH_3$-based SiN | 1.9868 |
| compressive stress $NH_3$-based SiN | 1.9319 |

TABLE 4

| Structure | Overall stress in SiN layer alone (MPa) | Overall stress in SiN-SiO₂ stack (MPa) |
|---|---|---|
| TEOS-based SiO2 on neutral stress N2/H2 SiN | 22 | 2 |
| TEOS-based SiO2 on compressive stress N2/H2 SiN | −200 | −80 |
| TEOS-based SiO2 on neutral stress NH3-based SiN | 47 | 2 |
| TEOS-based SiO2 on compressive stress NH3-based SiN | −391 | −214 |

The $N_2/H_2$-based layers show a higher refractive index, which is indicative of a higher Si content in the $N_2/H_2$ layers when compared with their $NH_3$-based counterparts. The net stress of the $SiN/SiO_2$ stack is less compressive than would be expected from stress values of the individual layers suggesting the intermediate layer is modifying the properties of the $SiO_2$ layer. In both cases, stress could be tuned though modifications to process conditions.

The neutral stress $SiO_2$ layers were deposited at approximately 250° C. using a $TEOS/O_2/H_2/He$ chemistry and were able to support deposition rates of up to 1.5 µm/min. Process details are found in Table 5 below.

TABLE 5

| Process Parameter | Neutral TEOS-based SiO₂ |
|---|---|
| Pressure (Torr) | 4 |
| TEOS flow rate (sccm) | 5 |
| O₂ flow rate (slpm) | 6.5 |
| H₂ flow rate (slpm) | 1 |
| He flow rate (sccm) | 200/1250 |
| High Frequency Power (Watts) | 1950 |
| Low Frequency Power (Watts) | 350 |

The He flow rate of 1250 sccm acts as a carrier gas for the TEOS while the 200 sccm is directly fed in another line to the gas distribution plate to stabilize the plasma and maintain reproducible operation. By adjusting the power of the High Frequency and Low Frequency sources, the overall stress of the $SiO_2$ layer can be effectively controlled. For example, the layer could be made compressive with a High Frequency source at 2300 W and a Low Frequency source at 550 W while the layer could be made tensile using a 1500 W High Frequency source. Measured stress values for the layers and refractive indices are shown in Table 6 below.

TABLE 6

| Process Parameter | Compressive TEOS-based SiO₂ | Neutral TEOS-based SiO₂ | Tensile TEOS-based SiO₂ |
|---|---|---|---|
| Refractive Index | 1.4503 | 1.4404 | 1.4342 |
| Overall stress (MPa) | −148 | −9 | 188 |

Without being bound by any theory or conjecture, the SiN in the intermediate layer appears to surprisingly influence the structure of the $SiO_2$—as measured by the widening of the Si—O FTIR peak at 1183 cm$^{-1}$ which is indicative of a reduction in density of the TEOS-based $SiO_2$ layer. The structural change in the TEOS seems to be relatively independent of the origin of the SiN in the intermediate layer as determined by the refractive index of the $SiO_2$ layer and FTIR spectra. Without wishing to be bound by any theory or conjecture, it is speculated that the presence of SiN in the intermediate layer improves adhesion of the TEOS-based $SiO_2$ onto the substrate, especially when the substrate is formed of or comprises Si. It is speculated that the compressive stress of the intermediate layer reduces the net stress of the intermediate layer/$SiO_2$ stack when a neutral stress $SiO_2$ layer is deposited onto the intermediate layer. The net compressive stress increases the cracking threshold of the TEOS-based $SiO_2$ layer and increases the thickness of the $SiO_2$ layer that can be deposited before cracking or delamination occurs. Surprisingly, the SiN in the intermediate layer influences the structure of the $SiO_2$ layer above, as measured by the widening of the Si—O FTIR peak at 1183 cm$^{-1}$. This peak widening is indicative of a reduction in density of the TEOS-based $SiO_2$ layer. The structural change in the TEOS-based $SiO_2$ layer seems to be relatively independent of the origin of the SiN component of the intermediate layer as determined by the refractive indices and FTIR.

It should be noted that the neutral stress TEOS-based $SiO_2$ could be deposited as a single layer or in steps to form multiple $SiO_2$ layers, each layer having a neutral stress, with no change in cracking performance. Preferably, if multiple $SiO_2$ layers are present, the overall stress of the at least one $SiO_2$ layer is between −50 MPa and +50 MPa, optionally between −30 MPa and +30 MPa, to ensure that the overall stress of the $SiO_2$ deposit as a whole is neutral. The provision of multiple layers of $SiO_2$ can allow for periodic cleaning of the chamber during the second deposition step to prevent contamination of the $SiO_2$ layer(s). Multiple $SiO_2$ layers can be deposited in single wafer chambers or a cluster tool or in a multi-station PECVD tool if required. The intermediate layer and TEOS-based SiO2 could be deposited in the same chamber or different chambers with no change in cracking performance. Following the intermediate layer deposition, the process can either be continued under vacuum or a vacuum break could be carried out prior to commencing the TEOS-based $SiO_2$ deposition. The choice of chambers and deposition sequence will largely be governed by tool configuration.

The invention claimed is:

1. A method of depositing silicon dioxide onto a substrate by plasma enhanced chemical vapour deposition (PECVD), the method comprising the steps of:

providing the substrate in a chamber;

performing a first deposition step by PECVD to deposit an intermediate layer onto the substrate, the intermediate layer comprising silicon nitride; and performing a second deposition step by PECVD to deposit at least one silicon dioxide layer onto the intermediate layer, wherein the first deposition step comprises introducing a first gas mixture comprising silane, nitrogen gas, and either hydrogen gas or ammonia gas into the chamber, and sustaining a plasma in the chamber from the first gas mixture at a temperature of between about 220° C. and about 300° C. so as to deposit the intermediate layer onto the substrate, wherein the second deposition step comprises introducing a second gas mixture comprising tetraethyl orthosilicate into the chamber, and sustaining a plasma in the chamber from the second gas mixture at a temperature of between about 220° C. and about 300° C. so as to deposit the at least one silicon dioxide layer onto the intermediate layer, and wherein the intermediate layer has an overall compressive stress of between −400 MPa and −100 MPa and each of the at least one silicon dioxide layer has an overall neutral stress of between −50 MPa and +50 MPa and the total thickness of the at least one silicon dioxide layer is at least 10 μm.

2. The method according to claim 1, wherein the second gas mixture further comprises oxygen gas, and wherein the oxygen gas is introduced into the chamber during the second deposition step at a flow rate in a range of about 1.0 slpm to about 10 slpm.

3. The method according to claim 1, wherein the second gas mixture further comprises hydrogen gas, and wherein the hydrogen gas is introduced into the chamber during the second deposition step at a flow rate in a range of about 0.25 slpm to about 2.0 slpm.

4. The method according to claim 1, wherein the second gas mixture further comprises helium gas, wherein a flow rate of the helium gas introduced into the chamber in the second deposition step is in a range of about 1000 sccm to about 2000 sccm.

5. The method according to claim 4, wherein, during the second deposition step, the helium gas is introduced into the chamber through two or more gas inlets, wherein a flow rate of the helium gas introduced into the chamber in the second deposition step is in a range of about 1000 sccm to about 2000 sccm, and wherein the flow rate of the helium gas introduced into the chamber in the second deposition step through a first gas inlet of the at least two gas inlets is in the range of about 600 sccm to about 1900 sccm and/or the flow rate of the helium gas introduced into the chamber in the second deposition step through a second gas inlet of the at least two gas inlets is in the range of about 50 sccm to about 500 sccm.

6. The method according to claim 1, wherein the silane is introduced into the chamber during the first deposition step at a flow rate in a range of about 50 sccm to about 400 sccm.

7. The method according to claim 1, wherein the nitrogen gas is introduced into the chamber during the first deposition step at a flow rate in a range of about 2000 sccm to about 8,000 sccm.

8. The method according to claim 1, wherein the hydrogen gas is introduced into the chamber in the first deposition step at a flow rate in a range of about 250 to about 750 sccm.

9. The method according to claim 1, wherein the ammonia gas is introduced into the chamber in the first deposition step at a flow rate in a range of about 25 sccm to about 500 sccm.

10. The method according to claim 1, wherein the tetraethyl orthosilicate is introduced into the chamber during the second deposition step at a flow rate in a range of about 1 sccm to about 10 sccm.

11. The method according to claim 1, wherein during the first deposition step and/or the second deposition step, a process temperature is less than less than about 280° C. and/or the process temperature is more than about 225° C.

12. The method according to claim 1, wherein the plasma in the first deposition step is sustained using a high frequency RF power having a frequency in a range of 10 MHz to about 15 MHz, the high frequency RF power having a power in a range of about 500 W to about 1500 W.

13. The method according to claim 1, wherein the plasma in the second deposition step is sustained using a high frequency RF power having a frequency in a range of 10 MHz to about 15 MHz, and a low frequency RF power having a frequency in a range of 100 kHz to about 500 kHz.

14. The method according to claim 13, wherein the high frequency RF power in the second deposition step has a power in a range of about 1500 W to about 3000 W, and wherein the low frequency RF power in the second deposition step has a power in a range of about 200 W to about 600 W.

15. The method according to claim 1, wherein the overall compressive stress of the intermediate layer is at least −100 MPa.

16. The method according to claim 1, wherein the thickness of the intermediate layer is at least 0.05 μm.

17. The method according to claim 1, wherein the overall neutral stress of each of the at least one silicon dioxide layer is between −30 MPa and +30 MPa.

18. The method according to claim 1, wherein the substrate is silicon.

19. The method according to claim 1, wherein the substrate is removed from the chamber between the first deposition step and the second deposition step.

20. A substrate with at least one silicon dioxide layer deposited thereon using the method according to claim 1, wherein each of the at least one silicon dioxide layer has an overall neutral stress of between −50 MPa and +50 MPa and the total thickness of the at least one silicon dioxide layer is at least 10 μm.

21. The substrate according to claim 20, wherein the total thickness of the at least one silicon dioxide layer is at least 20 μm.

22. A plasma enhanced chemical vapour deposition apparatus for depositing silicon dioxide onto a substrate by plasma enhanced chemical vapour deposition, the apparatus comprising:

a chamber;

a substrate support disposed within the chamber for supporting a substrate thereon;

at least one gas inlet for introducing a gas or gas mixture into the chamber at a flow rate;

a plasma generating means for sustaining a plasma in the chamber;

a high frequency power supply means configured to supply a high frequency RF power supply to the at least one gas inlet;

a low frequency power supply means configured to supply a low frequency RF power supply to the at least one gas inlet; and a controller configured to switch between a first set of processing conditions and a second set of processing conditions, wherein the first set of processing conditions are configured to perform a first deposition step to deposit an intermediate layer onto the substrate, the intermediate layer comprising silicon nitride and the second set of processing conditions are configured to perform a second deposition step to deposit at least one silicon dioxide layer onto the intermediate layer, wherein the first set of processing conditions are configured to perform the first deposition step by introducing a first gas mixture comprising silane, nitrogen gas, and either hydrogen gas or ammonia gas into the chamber through the at least one gas inlet, and sustaining a plasma in the chamber from the first gas mixture using the plasma generating means at a temperature of between about 220° C. and about 300° C. so as to deposit the intermediate layer onto the substrate, wherein the second set of processing conditions are configured to perform the second deposition step by introducing a second gas mixture comprising tetraethyl orthosilicate into the chamber through the at least one gas inlet, and sustaining a plasma in the chamber from the second gas mixture using the plasma generating means at a temperature of between about 220° C. and about 300° C. so as to deposit the at least one silicon dioxide layer onto the intermediate layer, and wherein the intermediate layer has an overall compressive stress of between −400 MPa and −100 MPa and each of the at least one silicon dioxide layer has an overall neutral stress of between −50 MPa and +50 MPa and the total thickness of the at least one silicon dioxide layer is at least 10 μm and wherein performing the first deposition step by PECVD to deposit an intermediate layer onto the substrate, the intermediate layer comprising silicon nitride; and performing the second deposition step by PECVD to deposit at least one silicon dioxide layer onto the intermediate layer.

\* \* \* \* \*